United States Patent [19]

Sekino et al.

[11] Patent Number: 4,689,769
[45] Date of Patent: Aug. 25, 1987

[54] MAGNETIC BUBBLE MEMORY

[75] Inventors: Mituru Sekino; Minoru Hiroshima; Masahiro Yanai, all of Mobara, Japan

[73] Assignee: Hitachi, Ltd., Tokyo, Japan

[21] Appl. No.: 697,577

[22] Filed: Feb. 1, 1985

[30] Foreign Application Priority Data

Feb. 1, 1984 [JP] Japan .................................. 59-15103

[51] Int. Cl.⁴ ............................................ G11C 19/08
[52] U.S. Cl. ...................................................... 365/15
[58] Field of Search ...................... 365/36, 43, 15, 41

[56] References Cited
PUBLICATIONS

IEEE Transactions on Magnetics—Vol. Mag-15, No. 9, Sep. 1979; pp. 1323–1325.
Electronics–Aug. 2, 1979; pp. 99–108.
IBM Technical Disclosure Bulletin—vol. 21, No. 10, Mar. 1979; p. 4258.

*Primary Examiner*—James W. Moffitt
*Attorney, Agent, or Firm*—Antonelli, Terry & Wands

[57] ABSTRACT

A magnetic bubble memory has the longitudinal direction of a minor loop, i.e. a row of permalloy patterns, on a magnetic film of a (111) crystal plane aligned with the [1$\bar{1}$0] crystal axis of the magnetic film. By aligning the direction of bubble transfer in the minor loop with the [1$\bar{1}$0] crystal axis, the bias magnetic field margin, $\Delta H_B$, is enabled to increase and the strength of the holding magnetic field, $H_{DC}$, is enabled to decrease.

5 Claims, 13 Drawing Figures $H_B = H_Z \cos\theta$
$H_{DC} = H_Z \sin\theta$

MAGNETIC BUBBLE MEMORY

BACKGROUND OF THE INVENTION

This invention relates to a magnetic bubble memory, and more particularly to a magnetic bubble memory having a prescribed positional relationship between the direction of magnetic bubble transfer and the crystallographic orientation of a magnetic film for magnetic bubbles.

Magnetic bubble memories have been moving toward increase of capacity from 1 M bits to 4 M bits and growth of integration, urging necessity of decreasing the bubble diameter. The decrease of the bubble diameter entails proportional loss in the room allowed for operations such as the magnetic bubble transfer. Various approaches to the solution of this problem have been under way. Improvement of the shape of permalloy pattern is one example. Originating in a concept entirely different from the conventional approaches, this invention has been perfected by elaborate analysis of the dependency of bias margin upon a crystal axis.

SUMMARY OF THE INVENTION

One object of this invention is to provide a magnetic bubble memory having a large bias magnetic field margin.

A further object of this invention is to provide a magnetic bubble memory permitting decrease in the strength of holding magnetic field.

Another object of this invention is to provide a magnetic bubble memory enabling an effective operation to be performed in a wide range of temperatures.

Yet another object of this invention is to provide a magnetic bubble memory adaptable to compact packaging.

Still another object of this invention is to provide a magnetic bubble memory permitting economization of power consumption.

In one aspect of the present invention, a magnetic bubble memory is provided which has the longitudinal direction of a minor loop, i.e. a row of permalloy patterns, on a magnetic film of a (111) crystal plane parallellized with the $[1\bar{1}0]$ crystal axis of the magnetic film. By parallellizing the direction of bubble transfer in the minor loop with the $[1\bar{1}0]$ crystal axis, the bias magnetic field margin, $\Delta H_B$, is enabled to increase and the strength of holding magnetic field, $H_{DC}$, to decrease.

The present invention, the other features of the present invention, and still other objects of the present invention will become apparent from the further disclosure of this invention to be made in the following detailed description of a preferred embodiment, with reference to the accompanying drawings.

DESCRIPTION OF THE PREFERRED EMBODIMENTS

The chip of a magnetic bubble memory element is produced by forming a magnetic film for holding magnetic bubbles on a substrate of the shape of a circular disc made of nonmagnetic garnet crystal by the method of liquid-phase epitaxial growth and superposing on the magnetic film a soft magnetic bubble transfer or propagation pattern of a magnetic material of high permeability (such as permalloy) by the photolithographic technique. Since the magnetic film itself has no pattern inscribed thereon, any discussion on the accuracy of alignment between the magnetic film and the photoprocessing mask for the permalloy is generally recognized as a matter of no great significance. Mask alignment, however, is indispensable to the relation between the permalloy layer and the conductor layer to be formed on the permalloy layer through the medium of an insulating layer and adapted to curb swap, replicate, and growth of bubbles. On the GGG (gadolinium-gallium-garnet) substrate, therefore, a main facet and a dummy facet intended as references are formed to facilitate the prealignment. The photoprocessing mask for the permalloy and the magnetic film are aligned with each other by utilizing the main facet and others. Thus, the significance of this alignment has been emphasized with respect to the subsequent alignment of the permalloy layer with the conductor layer.

In recent years, however, the transfer or propagation patterns have greatly diminished in size owing to the decrease of the optimum diameter of magnetic bubbles to less than about 2 μm and the steady growth of density. By the inventors' diligent experiment and elaborate analysis of test results, it has been demonstrated that the dependency of the characteristic of magnetic bubble transfer upon the crystal axes of the magnetic garnet continues to increase.

Figure 1:
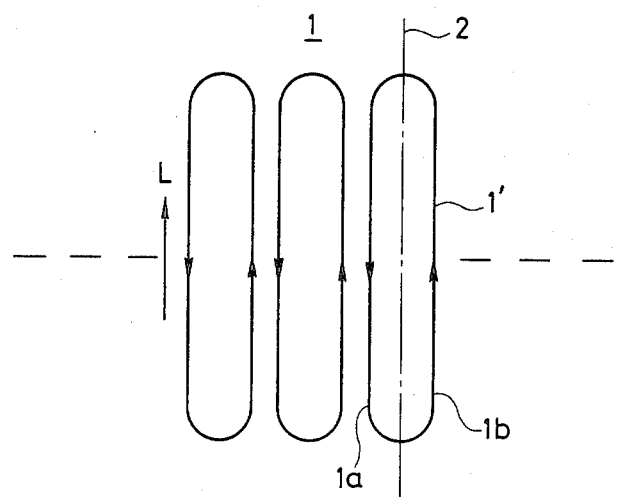
FIG. 1 is a schematic diagram illustrating a minor loop in a magnetic bubble memory element.

A illustrated in FIG. 1, a magnetic bubble is moved on a magnetic bubble transfer path 1' of a minor loop 1 by the operation of a rotating magnetic field. The direction of the magnetic bubble motion is reversed between a transfer path 1a falling on the lefthand side and a transfer path 1b on the righthand side, respectively of a central line 2 of the magnetic bubble transfer path 1'.

Figure 2:
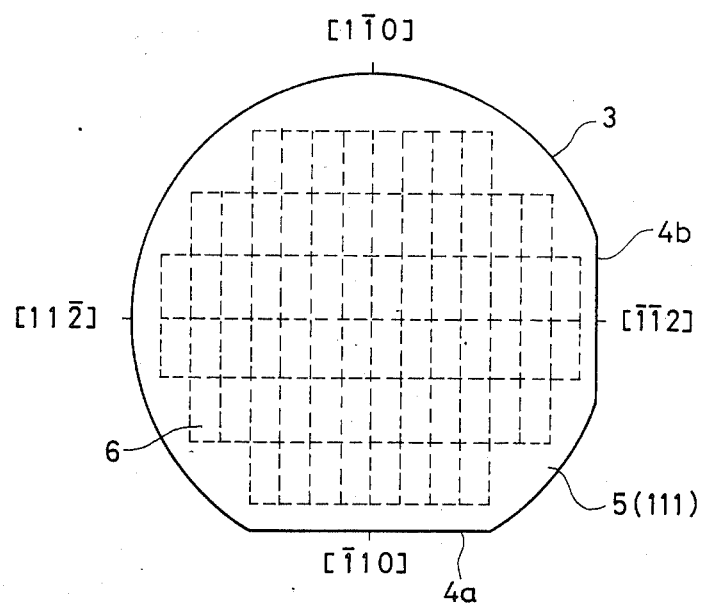
FIG. 2 is an explanatory diagram illustrating the crystallographic orientation of a magnetic film for magnetic bubbles.
Figure 3:
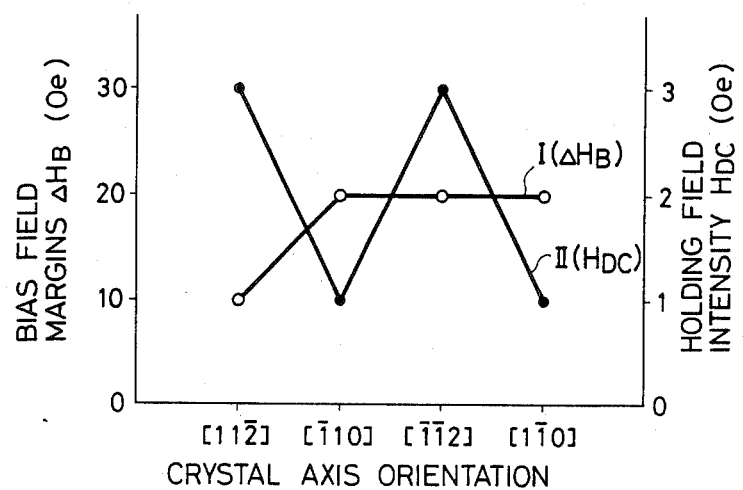
FIG. 3 is a characteristic diagram illustrating an operational margin relative to the crystallographic orientation.

When the direction of the transfer path 1a is selected in the direction of crystal axis in which the magnetic bubble is moved most easily, there naturally ensues the the problem that the magnetic bubble suffers from inferior mobility in the transfer path 1b. On a nonmagnetic garnet crystal substrate 3 having a main facet 4a and a dummy facet 4b formed therein as illustrated in FIG. 2, a magnetic bubble transfer path 1' having a varying relation between the crystallographic orientation of the magnetic film 5 for magnetic bubbles and the longitudinal direction L of the magnetic bubble transfer path 1' illustrated in FIG. 1 and it was tested for operational margin. The results are shown in FIG. 3. From FIG. 3, it is noted that the operational margin depends on the crystal axis. The characteristic curve I indicates that when the longitudinal direction of the transfer path 1' falls in the [11$\bar{2}$] crystal axis, the bias magnetic field margin, $\Delta H_B$, of the magnetic bubble transfer is lower than when the direction falls in any other crystal axis. In the meantime, the characteristic curve II of the same diagram indicates that the start-stop operation of the bubble transfer is degraded when the longitudinal direction of the transfer path 1' falls in the [11$\bar{2}$] and [$\bar{1}\bar{1}$2] crystal axes. These problems manifest themselves conspicuously when the magnetic bubble memory element gains in density and when the memory is operated at low temperatures. This particular phenomenon has been found to be responsible for the increasing limitation that the magnetic bubble memory element is imposing on the range and its working temperatures.

It is noted from FIG. 3 that the bias margin, $\Delta H_B$, is increased by parallellizing the direction of bubble transfer in the minor loop with the [$\bar{1}$10], [$\bar{1}\bar{1}$2], and [1$\bar{1}$0] crystal axes and the strength of holding magnetic field, $\Delta H_{DC}$, is decreased by parallellizing the aforementioned direction with the [$\bar{1}$10] and [1$\bar{1}$0] crystal axes. This means that since the minor loop generally possesses two directions, forward and backward, for bubble transfer, the magnitudes, $\Delta H_B$ and $H_{DC}$, are enabled to be simultaneously improved by parallellizing the longitudinal direction with the [$\bar{1}$10] crystal axis and the [1$\bar{1}$0] crystal axis.

Figure 7:
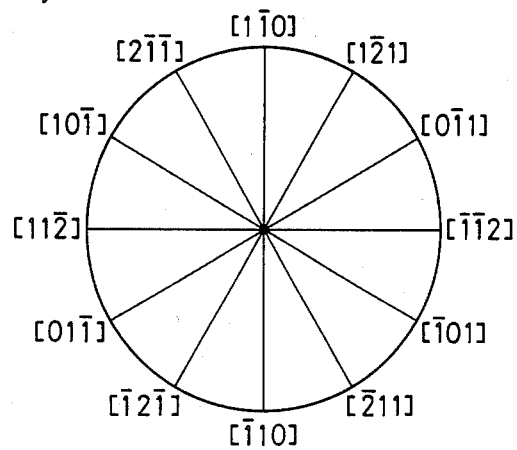
FIG. 7 illustrates the threefold symmetry crystallographic structure of the magnetic bubble film in accordance with the present invention.

The crystallographic structure of the magnetic bubble film assumes threefold symmetry as shown in FIG. 7. The [$\bar{1}$10] crystal axis, the [10$\bar{1}$] crystal axis, and the [0$\bar{1}$1] crystal axis are equal to one another (first group) and the [1$\bar{1}$09] crystal axis, the [$\bar{1}$01] crystal axis, and the [01$\bar{1}$] crystal axis are equivalent (second group). In other words, the bubble film possesses equivalent crystal axes separated apart from one another by unit angles of 120°. For the convenience of reference, the first group will be represented by the [$\bar{1}$10] crystal axis and the second group by the [1$\bar{1}$0] crystal axis respectively. FIG. 7 represents a diagram produced by projecting polar coordinates. It is the [111] crystal axis that is normal to the plane of projection (i.e. perpendicular to the paper containing the diagram).

Figure 4:
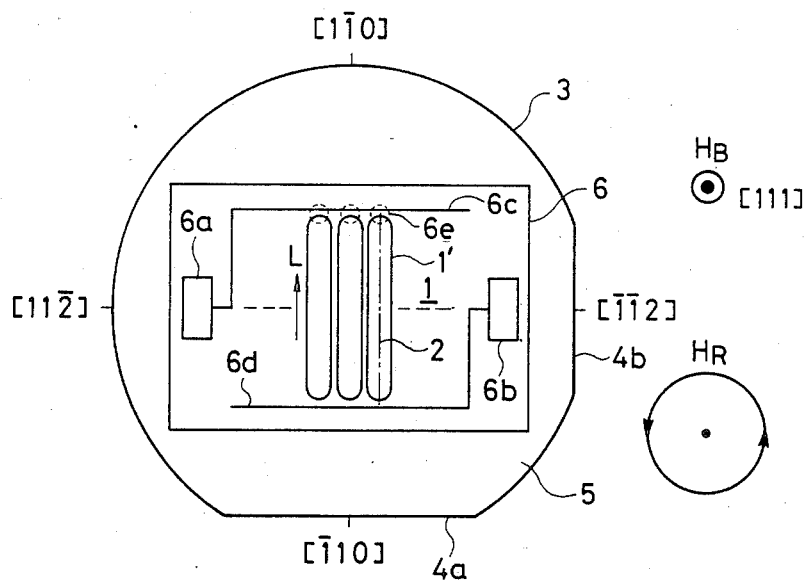
FIG. 4 is an explanatory diagram of a typical magnetic bubble memory element according to the present invention.

FIG. 4 is a plan view of a substrate, drawn to facilitate description of a typical magnetic bubble memory element. The same parts as found in the aforementioned diagrams are denoted by like symbols. With reference to FIG. 4, on the magnetic film 5 for magnetic bubbles in the (111) crystal plane, various function patterns including a minor loop 1, a magnetic bubble detector 6a, a magnetic bubble generator 6b, a read major line 6c, a write major line 6d, and a magnetic bubble divider 6e are formed to provide a magnetic bubble memory element 6. The minor loop 1 is patterned so that the central axis 2 in the longitudinal direction L thereof will fall within ±5° of the [1$\bar{1}$0] crystal axis of the magnetic film 5. The bias magnetic field, $H_B$, for retaining the magnetic bubble is applied upwardly from below the paper, namely in the [111] crystal axis, and the rotating magnetic field, $H_R$, is applied in the counterclockwise direction.

Figure 8:
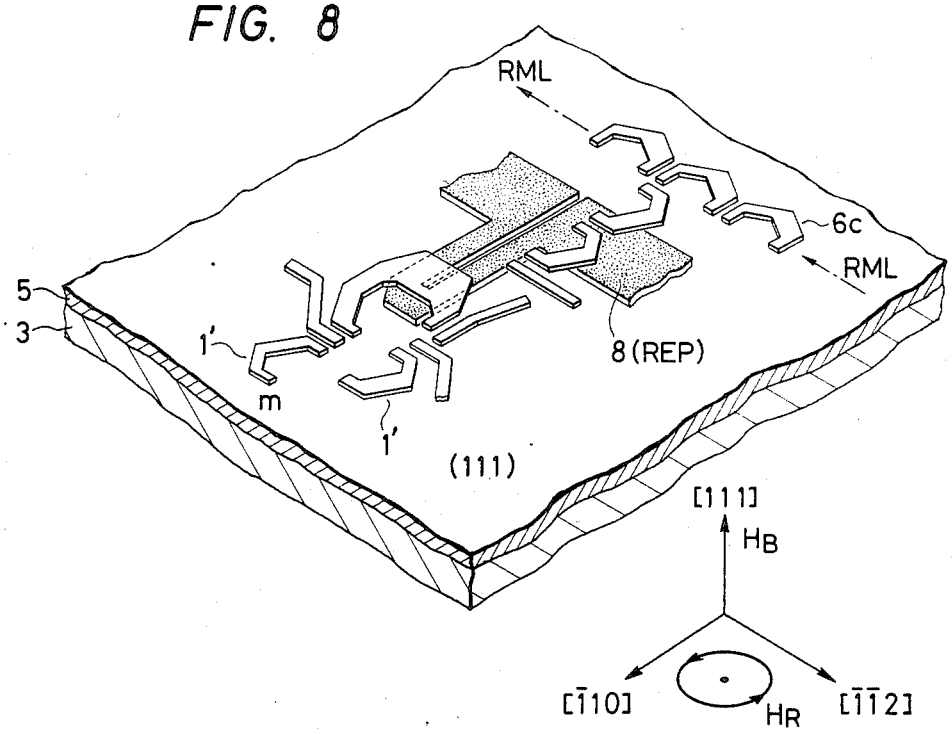
FIG. 8 is a perspective enlarged view of a bubble memory chip in accordance with the present invention.

In FIG. 4, a bubble memory chip 6 is drawn in a size exaggerated relative to the size of a wafer 3. Actually on the wafer 3, a multiplicity of chips are formed as illustrated by dotted lines in FIG. 2. It is the perspective view of FIG. 8 that shows part of this bubble memory chip 6 as enlarged. This diagram is intended to show the folded end of the minor loop 1', the read major line 6c, the replicate gate part, the conductor layer 8 for the control of the replicate gate. Insulating layers which are interposed on each between the magnetic film 5 and the conductor layer 8 and between the conductor layer 8 and the permalloy pattern are omitted from the diagram. The row of patterns constituting the minor loop 1' formed of permalloy patterns is parallellized with the [$\bar{1}$10] crystal axis and [1$\bar{1}$0] crystal axis. The major line 6c forms the direction of bubble transfer in the [11$\bar{2}$] crystal axis. In accordance with the data of analysis given in FIG. 3, this is not a desirable direction from the standpoint of transfer characteristic. Nevertheless the bias margin is large relative to the highly densified minor loop. In other words, the orientation of the minor loop enjoys priority over that of the minor loop.

The magnetic bubble memory element constructed as described above was operated with the minor loop thereof filled with magnetic bubbles and the chip kept at a low temperature to determine the relation between the bias magnetic field margin, $\Delta H_B$, for magnetic bubble transfer and the rotating magnetic field, $H_R$. Consequently, there were obtained data indicated by the characteristic curve I in FIG. 5. It is noted from these data that the bias magnetic field margin in enabled to increase and the magnetic bubbles are enabled to move sufficiently even with a small rotating magnetic field, $H_R$, by parallellizing the longitudinal direction L of the minor loop 1 with the [1$\bar{1}$0] crystal axis of the magnetic film 5 for magnetic bubbles. The characteristic curve II represents the data when the minor loop 1 is so patterned that the central axis 2 of the longitudinal direction L of the minor loop 1 described above falls within ±5° of the [11$\bar{2}$] or [$\bar{1}\bar{1}$2] crystal axis of the magnetic film 5 for magnetic bubbles. From this characteristic curve II, it is noted that the bias magnetic field margin, $\Delta H_B$, is notably decreased.

Figure 6:
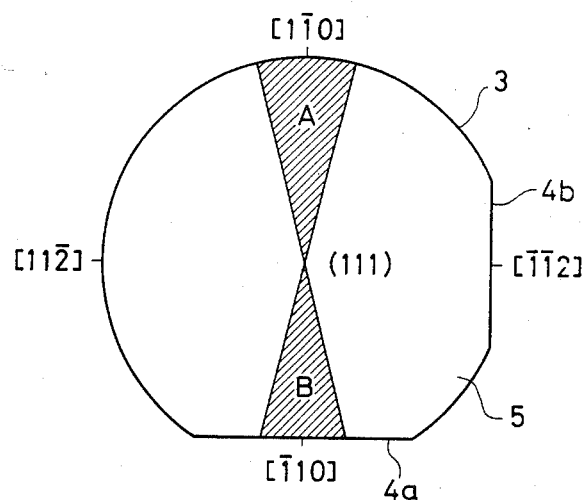
FIG. 6 is an explanatory diagram showing the relation between the longitudinal direction of the minor loop in the magnetic bubble memory element according to the present invention and the crystallographic orientation of the magnetic film for magnetic bubbles.

The aforementioned effects of the present invention are fully manifested so long as the directional deviation of the minor loop relative to the [1$\bar{1}$0] and [$\bar{1}$10] crystal axes is confined within the range of about ±5° as indicated by the hatch lines of FIG. 6 in due consideration of the error involved during the production of crystal, the error of about ±2° involved in the facet cutting, the tolerance of ±1° to 2° in the accuracy of alignment of permalloy mask pattern, and the error of about ±2° n the measurement of the crystal axes.

Now regarding the bubble memory to which this invention is applied, the memory chip and its periphery will be described below.

Figure 9:
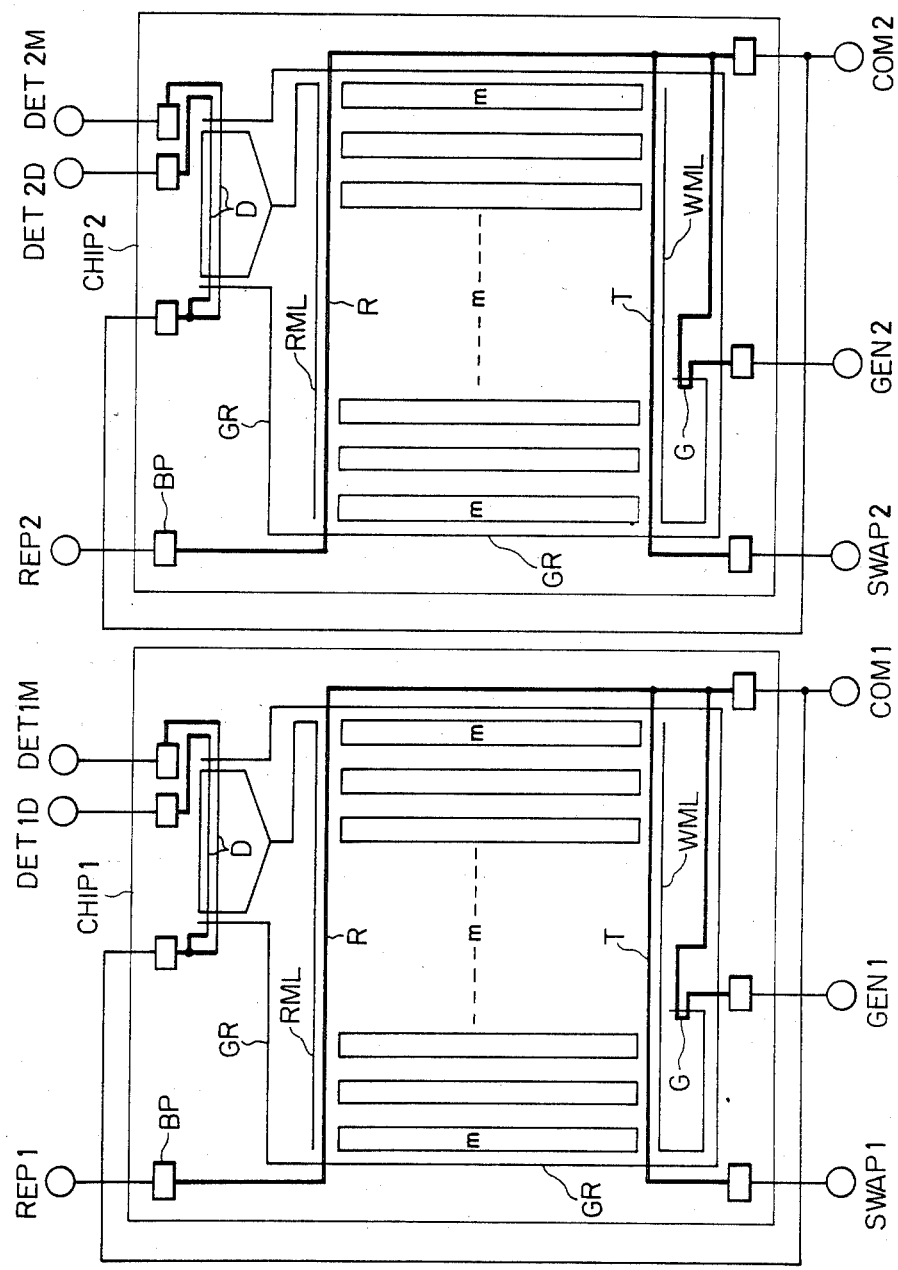
FIG. 9 schematically illustrates two magnetic bubble memory chips for mounting in a package.

FIG. 9 schematically illustrates two magnetic bubble memory (MBM) chips, CHIP 1 and CHIP 2, which have passed the test as acceptable. They are mounted in a MBM package. The choice of this configuration of two separate chips is because it warrants better yield of production than the configuration having components equivalent to two chips integrated in one unit.

In FIG. 9 are shown minor loops m for storing information, a read major line WML for transferring the read out information and a write major line WML for transferring the written information, a bubble detector D for converting magnetic bubbles into electrical signals, a bubble generator G for generating magnetic bubbles and a replicate gate circuit R for replicating or transferring the information of the minor loops m to the read major line RML. Further, T represents a transfer gate circuit for transferring the information on the write major line WML to the minor loops m or a swap gate for swapping the information of the minor loops m to the major line WML at the same time that the transfer of information proceeds, that is, for exchanging information between them. Further, a guard rail GR surrounding the outer periphery prevents entry of magnetic bubbles. The gates R and and the bubble generator G are controlled, depending on whether or not a current in a prescribed direction is supplied to conductors in a separate layer disposed in a particular relationship with the propagation pattern of permalloy. In the drawing, the conductor portion is represented by a thick solid line and the propagation pattern of the permalloy is represented by fine solid lines. The conductor layers respectively for the replicate gate, swap gate and bubble generator are connected on one ends thereof in common within the chip and, further, connected on the wiring circuits board outside the chip together with one of the common terminals for the main and dummy magnetic resistance elements of the bubble detector to common terminals COM 1 and COM 2.

Figure 10A:
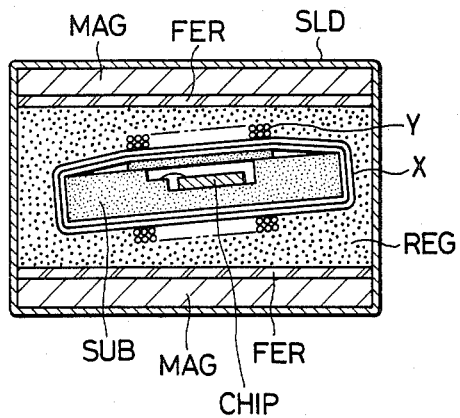
FIGS. 10A, 10B and 10C illustrate a cross-sectional view of a package mounting the magnetic bubble chips, a representation of the magnetic field components, and a representation of the rotating magnetic field, respectively.

FIG. 10A illustrates a package having mounted therein for ready service two chips produced as described above. In the diagram, SUB denotes a wiring substrate made of synthetic resin or ceramic substance and supporting thereon CHIP 1 and CHIP 2. X and Y denote coils for imparting rotating magnetic fields to the chips. MAG denotes a permanent magnet adapted to confer a vertical bias magnetic field, $H_B$, upon the chip plane thereby to permit stable retention of bubbles. FER is a rectifier plate formed of a material such as ferrite and adapted to uniformize the bias magnetic field. The components described above are air tight sealed with epoxy type resin REG. A matallic plate SLD for intercepting magnetism and static electricity encloses the package.

Figure 10B:
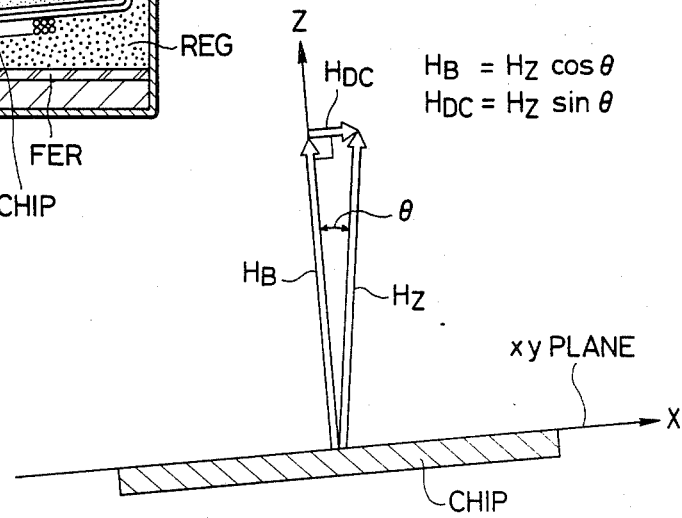

The wiring substrate SUB having the chips mounted as described above is molded with resin as inclined by an angle of about 2° relative to the magnet MAG. This inclination is intended for the bias magnetic field, $H_B$, to be applied as slightly deviated from the vertical direction. This design ensures generation of a holding magnetic field, $H_{DC}$, which improves the start and stop margin for the bubble transfer by about 6 [Oe] (FIG. 10B). As noted from FIG. 3, therefore, when the direction of the minor loop is made to coincide with the [11$\bar{2}$] crystal axis or the [$\bar{1}$12] crystal axis, the holding magnetic field, $H_{DC}$, must be correspondingly increased and, as the result, the angle of inclination, $\theta$, of the substrate SUB is inevitably increased and the package as a whole is increased in thickness. In this respect, the parallellization of the direction of the minor loop with the [110] crystal axis results in a decrease in the thickness of the package.

In FIG. 10B, the magnitude of the component $H_{DC}$ is $H_z \cdot \sin \theta$, and the inclination angle $\theta$ is usually selected so as to hold $H_z \cdot \sin \theta = 5$ to 6 oersteds. The direction of the component $H_{DC}$ is so determined as to coincide with the start/stop direction (+X axis direction) of the rotating magnetic field $H_R$. The component $H_{DC}$ parallel to the XY plane effectively acts on start/stop operation of the rotating magnetic field $H_R$ and is known as the holding field. A component $H_B$ of the bias magnetic field normal to the surface of the CHIP 1 has a magnitude of $H_z \cdot \cos \theta$.

Figure 10C:
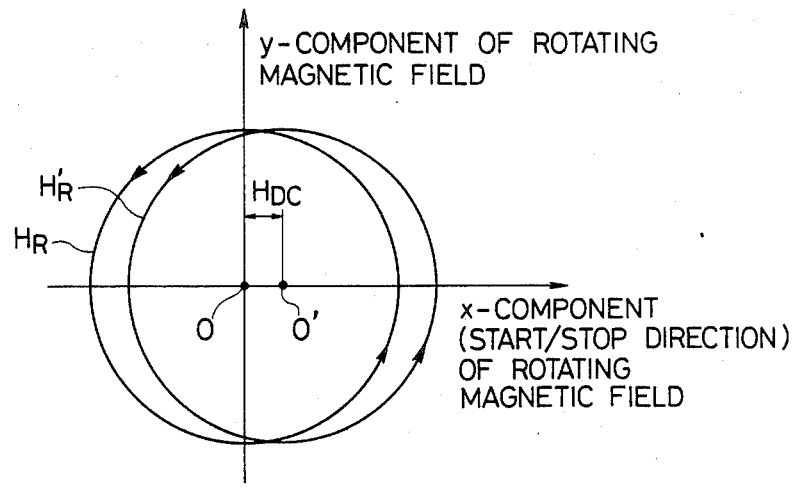

The holding field $H_{DC}$ is constantly created within the XY plane of the CHIP 1, and therefore as shown diagramatically in FIG. 10C a rotating magnetic field $H'_R$ acting on the chip in the presence of $H_{DC}$ becomes eccentric while the center of the rotating magnetic field $H_R$ to be applied externally is at 0. In other words, the rotating field $H'_R$ acting on the CHIP 1 is a resultant of the rotating field $H_R$ applied externally and the component $H_{DC}$ and the center 0′ of the rotating magnetic field $H'_{DC}$ undergoes a parallel motion in the direction of +X axis by the magnitude of the component $H_{DC}$ that is, in the direction of the start/stop of the external rotating magnetic field. As is clear from FIG. 10C even if the intensity of the rotating magnetic field $H_R$ applied externally is $|H_R|$, the intensity $|H'_R|$ of the rotating field effectively acting on the CHIP 1 becomes different depending on the phase of the rotating magnetic field $H_R$. That is to say, $|H'_R|$ in the start/stop direction becomes $|H_R| + |H_h|$, which is stronger than $|H_R|$ by $|H_h|$, the intensity of the holding field $H_{DC}$. Conversely, $|H'_R|$ in the direction opposite to start/stop becomes $|H_R| - |H_n|$ and is weaker by $|H_n|$ compared to $|H_R|$.

When the holding magnetic field, $H_{DC}$, is decreased by the alignment with the [$\bar{1}$10] crystal axis, therefore, the extent of weakening of the total magnetic field, $H_R'$, in the direction opposite the start-stop direction, making it no longer necessary to decrease the transfer margin in that direction notably.

Figure 5:
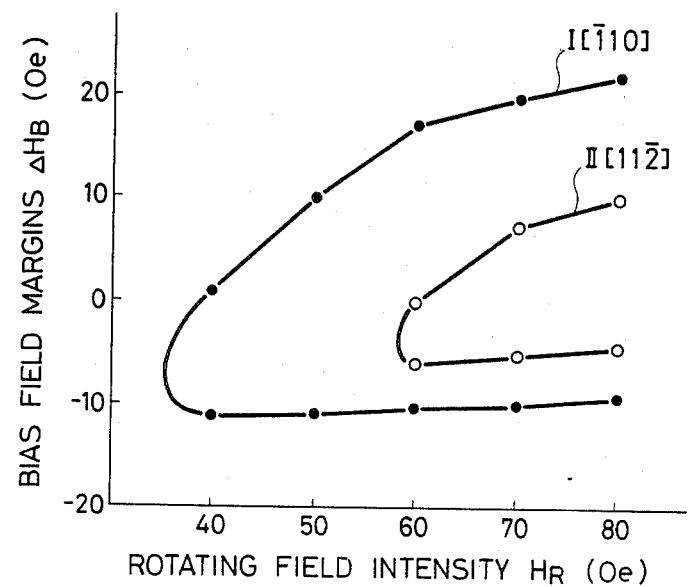
FIG. 5 is a characteristic diagram showing the bias magnetic field margin, $\Delta H_B$, relative to the rotating magnetic field, $H_R$.

By the alignment with the [$\bar{1}$10] crystal axis, the bias margin, $\Delta H_B$, is obtained amply with a small strength of rotating magnetic field, $H_B$, as shown in FIG. 5, permitting a reduction in power consumption.

Figure 11:
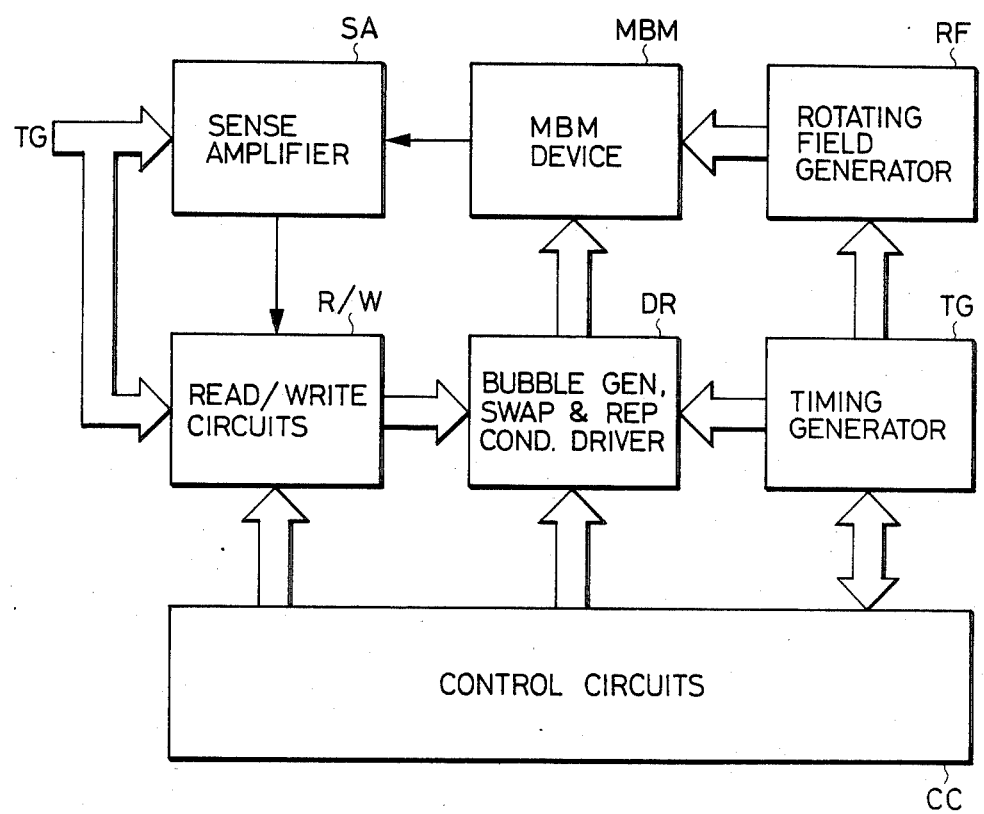
FIG. 11 illustrates in block diagram form the circuit arrangement for operating the magnetic bubble memory in accordance with the present invention.

As described above, various advantageous effects are brought about in the periphery of the MBM chip by the adoption of the alignment with the [$\bar{1}$10] magnetic axis. Finally, the peripheral circuit of the MBM device will be described with reference to FIG. 11. In the diagram, RF denotes a circuit for generating a rotating mangetic field, $H_R$, by passing electric currents involving a phase difference of 90° through the coils, X and Y, in the MBM device. SA denotes a sense amplifier for sampling, sensing, and amplifying feeble bubble detection signlas from the electromagnetic resistive element of the MBM device in concert with the timing of the rotating magnetic field. DR denotes a drive circuit for passing electric currents at prescribed timing to the various functional conductors of the replacates regarding information, swap, and read of bubble data in consequence of the writing of data in the MBM device. These circuits are synchronized by a timing generator circuit TG so as to be operated as synchronized with the cycle and phase angle of the rotating magnetic field, $H_R$.

What is claimed is:
1. A magnetic bubble memory comprising;
   a magnetic film of threefold symmetry crystallographic structure for holding magnetic bubble domains and having a crystallographic surface substantially parallel to a (111) plane, a plurality of minor loops each having a plurality of propagation patterns of soft magnetic material for propagating and storing said bubble domains in cooperation with said magnetic film, and a major line substantially perpendicular to said minor loops for propagating bubbles in parallel from and/or to said minor loops, said minor loops having an orientation parallel to one selected from the group consisting of [$\bar{1}$10], [0$\bar{1}$1], [10$\bar{1}$], [1$\bar{1}$0], [011$\bar{1}$] and [$\bar{1}$01] crystal axes.

2. A magnetic bubble memory comprising:

a magnetic crystalline film of threefold symmetry crystallographic structure for holding magnetic bubble domains and having a principal surface substantially parallel to a (111) plane, a plurality of rows and a column, a plurality of minor loops, each having a plurality of propagation patterns of soft magnetic material arrayed in each of said rows, for propagating and storing said bubble domains in each of said rows, a major line arrayed in said column for propagating bubbles in parallel from and/or to said minor loops, each of said rows having an orientation parallel to one selected from the group consisting of [$\bar{1}$10], [0$\bar{1}$1] and [10$\bar{1}$] crystal axes.

3. A magnetic bubble memory comprising:

a memory chip including;

a magnetic crystalline film of threefold symmetry crystallographic structure for holding magnetic bubble domains and having a principal surface substantially perpendicular to a [111] axis, a plurality of rows, each of said rows having an orientation parallel to one selected from the group consisting of [$\bar{1}$10], [0$\bar{1}$1] and [10$\bar{1}$] crystal axes, a column, a plurality of minor loops, each having a plurality of propagation patterns of soft magnetic material arrayed in each of said rows, a major line arrayed in said column, and gate means for controllably propagating said bubble domains in parallel from and/or to said minor loops;

a magnet for applying to said memory chip a magnetic bias filed with an inclination angle in relation to the direction perpendicular to said principal surface; and a pair of coils perpendicularly intersecting each other for applying a rotating magnetic field to said chip to propagate said bubble domains in said column and each of said rows.

4. A magnetic bubble memory comprising:

a memory chip including;

a magnetic crystalline film of threefold symmetry crystallographic structure having a principal surface substantially parallel to a (111) plane, a plurality of rows, each of said rows having an orientation parallel to one selected from the group consisting of [$\bar{1}$10], [0$\bar{1}$1] and [10$\bar{1}$] crystal axes, a column, a plurality of minor loops, each having a plurality of propagation patterns of soft magnetic material arrayed in each of said rows, a major line arrayed in said column, and electro-magnetic gate circuits for controllably propagating said bubble domains in parallel from and/or to said minor loops;

a magnet for applying to said memory chip a magnetic bias field with an inclination angle in relation to the direction perpendicular to said principal surface;

rotating magnetic field generating circuits;

read and/or write circuits for driving said electro-magnetic gate circuits;

timing pulse generating circuits for synchronizing the operation of said read and/or write circuits with said rotating magnetic field generating circuits; and control circuits for controlling said read and/or write circuits and said magnetic field generating circuits.

5. A magnetic bubble memory comprising:

a memory chip including;

a magnetic crystalline film of threefold symmetry crystallographic structure for holding magnetic bubble domains having a principal surface substantially parallel to a (111) plane, a plurality of rows and columns, each of said rows having an orientation parallel to one selected from the group consisting of [$\bar{1}$10], [0$\bar{1}$1] and [10$\bar{1}$] crystal axes, a plurality of minor loops, each having a plurality of propogation patterns of soft magnetic material arrayed in each of said rows, for propagating and storing said bubble domains in each of said rows, a read major line arrayed in one of said columns, a write major line arrayed in another column, swap gates or write gates for transferring information in parallel from said write major line to said minor loops, replicate or read gates for transferring information in parallel from said minor loops to said read major line, an electro-magnetic resistive element for detecting whether said bubble exists or not in each information bit directed from said read major line, and a bubble generator for controllably generating at each bit said bubble which is to be directed to said write major line;

rotating magnetic field generating circuits for applying a rotating magnetic field to said memory chip to propagate said bubbles;

drive circuits for driving said gates and said bubble generator;

read/write circuits for controlling said drive circuits;

timing pulse generating circuits for generating synchronized pulses directed to said rotating magnetic field generating circuits and said read/write circuits and said control circuit for said read/write circuits and said rotating magnetic field generating circuits.

* * * * *